United States Patent
Dorozhkina et al.

(10) Patent No.: US 7,226,637 B2
(45) Date of Patent: Jun. 5, 2007

(54) MANUFACTURING METHOD FOR MULTILAYER FLUORESCENT INFORMATION CARRIERS

(75) Inventors: Galina Dorozhkina, Dolgoprodnij (RU); Irina Kiryusheva, Tel-Aviv (IL); Eugene Levich, New York, NY (US); Alexey Lezhnev, Moscow (RU); Dmitry Pebalk, Moscow (RU)

(73) Assignee: D Data Inc., New York, NY (US)

( * ) Notice: Subject to any disclaimer, the term of this patent is extended or adjusted under 35 U.S.C. 154(b) by 542 days.

(21) Appl. No.: 09/761,647

(22) Filed: Jan. 18, 2001

(65) Prior Publication Data

US 2001/0048977 A1    Dec. 6, 2001

Related U.S. Application Data

(60) Provisional application No. 60/176,294, filed on Jan. 18, 2000.

(51) Int. Cl.
*B05C 5/06* (2006.01)

(52) U.S. Cl. ............ 427/162; 427/164; 427/240; 427/425; 427/508; 427/510; 427/512; 427/157; 118/52; 118/319; 118/320; 369/272.1; 369/275.3; 369/283; 369/284; 369/286; 369/288; 369/94

(58) Field of Classification Search ........ 427/508, 427/510, 512, 157, 162, 164, 240, 425; 118/52, 118/319, 320; 369/272.1, 275.3, 283, 284, 369/286, 288, 94
See application file for complete search history.

(56) References Cited

U.S. PATENT DOCUMENTS

| | | | |
|---|---|---|---|
| 4,407,855 A * | 10/1983 | Russell ................. 427/512 |
| 5,120,811 A * | 6/1992 | Glotfelter et al. ......... 528/25 |
| 5,194,490 A * | 3/1993 | Suga et al. ............. 524/755 |
| 5,688,447 A | 11/1997 | Hong .................. 264/1.33 |
| 5,801,884 A * | 9/1998 | Sato et al. ............. 359/620 |
| 6,023,451 A * | 2/2000 | Kashiwagi et al. ...... 369/275.5 |
| 6,039,898 A | 3/2000 | Glushko ................ 264/1.33 |
| 6,071,671 A * | 6/2000 | Glushko et al. ....... 430/270.15 |
| 6,355,754 B1 * | 3/2002 | Olson et al. ............. 526/296 |
| 6,368,684 B1 * | 4/2002 | Onishi et al. ........... 428/32.6 |
| 2002/0066528 A1* | 6/2002 | Oxman et al. ......... 156/275.5 |

FOREIGN PATENT DOCUMENTS

| | | |
|---|---|---|
| EP | 0 913 444 A2 | 5/1999 |
| JP | 03-173954 A * | 7/1991 |
| WO | WO 98/50914 | 11/1998 |
| WO | WO 99/23652 | 5/1999 |
| WO | WO 99/47327 | 9/1999 |

* cited by examiner

*Primary Examiner*—Alain L. Bashore
(74) *Attorney, Agent, or Firm*—Winston & Strawn LLP

(57) ABSTRACT

An information layer for an optical information storage medium is formed in a centrifuge. A photopolymerizable composition is applied to a solid base having a relief pattern, and a flexible, transparent film layer is applied on top of the composition. The three are spun in a centrifuge to cause a thin, even distribution of the photopolymerizable composition, which is photopolymerized. The resulting replica is separated from the relief pattern and has a fluorescent material applied thereto. Alternatively, the replica has a non-fluorescent material applied thereto, and the non-fluorescent material is made fluorescent through diffusion. Multiple information layers thus formed can be glued together to form a multilayer optical information storage medium.

21 Claims, 3 Drawing Sheets

MANUFACTURING METHOD FOR MULTILAYER FLUORESCENT INFORMATION CARRIERS

REFERENCE TO RELATED APPLICATIONS

This application claims the benefit of U.S. Provisional Application No. 60/176,294, filed Jan. 18, 2000, whose disclosure is hereby incorporated by reference in its entirety into the present disclosure.

FIELD OF THE INVENTION

The present invention is directed to a method of manufacturing a multilayer fluorescent information carrier and more particularly to such a method in which materials are applied under the action of centrifugal forces.

DESCRIPTION OF RELATED ART

In digital storage, whether of software, music, motion pictures, or the like, it has long been desired to store ever more information in ever less space. Compact discs have been in use for roughly two decades to store music, software, and other materials in digital form. However, the fact that a compact disc has only one recording layer limits its information capacity.

To increase the capacity relative to a traditional compact disc, optical memory media with multiple layers have been developed. However, when such media are read by reflection of coherent light, parasitic reflection can occur at layer boundaries. That reflection and the resulting interference impair reading.

One such device is the multilayer fluorescent information carrier, examples of which are disclosed in U.S. Pat. No. 6,039,898, issued Mar. 21, 2000, and in WO 99/47327 A1, published Sep. 23, 1999. Such carriers exhibit high recording density, contrast, and signal-to-noise ratio. It is common to use fluorescent recording materials that, when exposed to reading light at one wavelength, fluoresce at a different wavelength. The problem of parasitic reflection can be solved by filtering out reflected light at the reading wavelength. Also, since the fluorescent light is incoherent, there is no problem of interference.

However, improvements remain to be made in the manufacture of such carriers. In particular, it would be desirable to decrease both the thickness and the thickness variation of the recording layers while increasing production speed and improving the information reproduction characteristics.

SUMMARY OF THE INVENTION

In light of the above, it is an object of the invention to decrease the thickness of the relief-carrying information layer.

It is another object of the invention to decrease the layer thickness variation.

It is another object of the invention to speed up the formation process for both a single layer and a multilayer structure through consecutive building-up information layers (IL).

It is another object of the invention to increase the fluorescent signal and its contrast, enabling an increase in the fluorescent carrier information capacity to reduce the requirement for a larger number of layers.

To achieve the above and other objects, the present invention is directed to a method of making a multilayer fluorescent information carrier in which a relief-carrying layer made of liquid photopolymerizing composition (PPC) is formed between a solid base disposed directly on a chuck and an overlying flexible film material, either of which should be actinic-radiation-transparent, and either of which can act as a stamper. Under the action of centrifugal forces, the relief-carrying layer is photo-solidified by light of a spectral range requisite for photopolymerization and separated from the stamper. The relief-carrying layer is then filled with a liquid composition with a fluorescent dye. The composition is photosolidified. Single-layer film fluorescent information carriers thus formed are arranged in a multilayer block via adhesive, cementing layers to obtain a multilayer fluorescent information carrier.

BRIEF DESCRIPTION OF THE DRAWINGS

Various preferred embodiments of the present invention will be set forth in detail with reference to the drawings, in which.

DETAILED DESCRIPTION OF THE PREFERRED EMBODIMENTS

The manufacturing process for the relief-carrying layer will be described with reference to FIGS. 1-6, with an alternative technique disclosed with reference to FIG. 7. Then, specific examples will be given.

Figure 1:
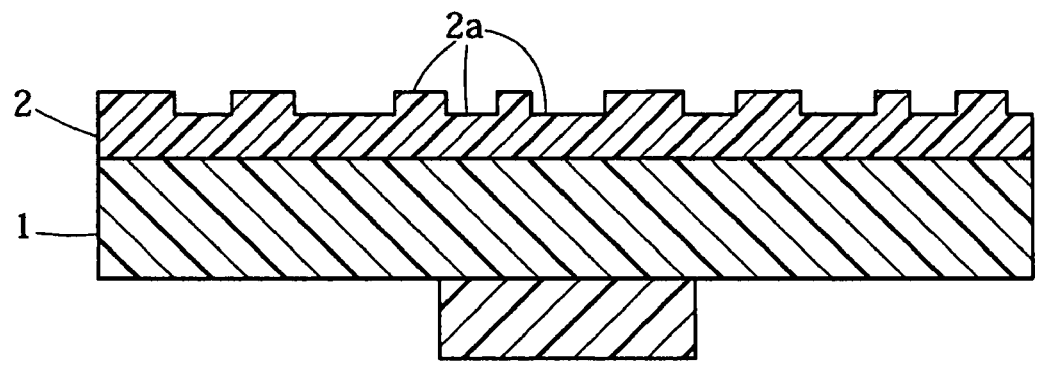
FIG. 1 shows a solid base placed on a centrifuge chuck.

The procedure takes place in a centrifuge having a centrifuge chuck 1. As shown in FIG. 1, a solid base 2 is placed on the centrifuge chuck 1. Optically transparent glass or polymer, including multilayer substrates with pre-fabricated ILs, and nontransparent materials, including metal, glass or polymer substrates, can be used as a solid base. The solid base 2 has surface details (a relief pattern) 2a as required to form the relief-carrying layer.

Figure 2:
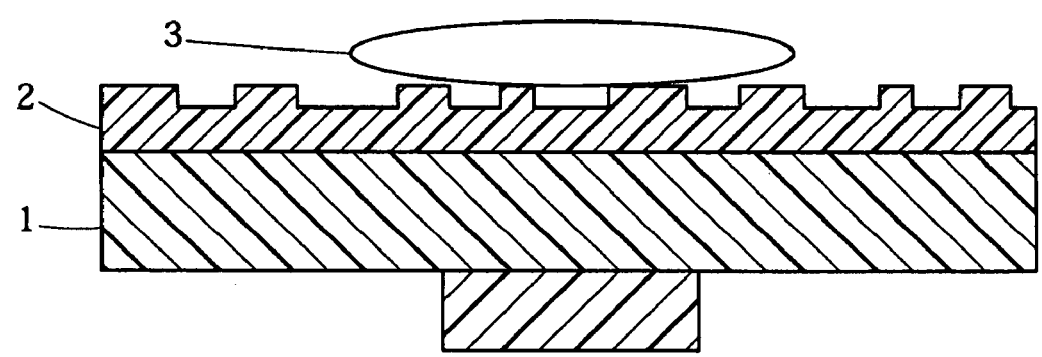
FIG. 2 shows the application of liquid photopolymeric composition to the base to form a layer.
Figure 3:
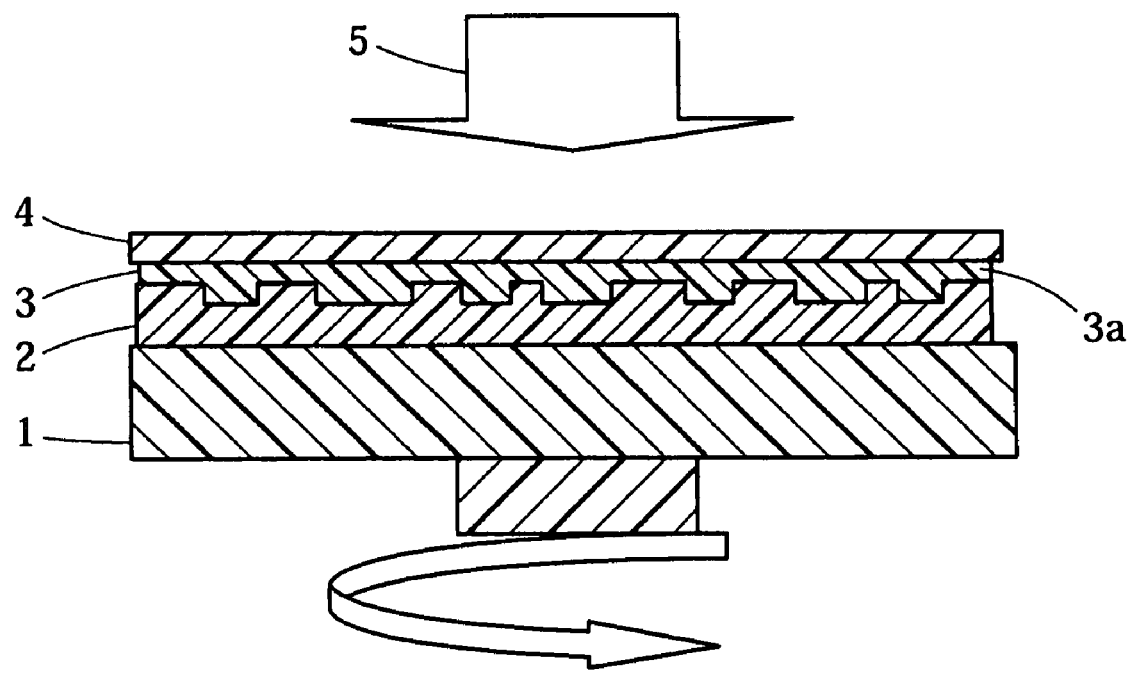
FIG. 3 shows irradiation of the layer with photopolymerizing light.

As shown in FIG. 2, a liquid photopolymeric composition (PPC) 3 is put onto the solid base 2. Then, as shown in FIG. 3, a flexible film material 4 is applied. Either the solid base 2 or the flexible film material 4 can serve as a stamper; that is, either the solid base or the flexible material can have the required surface relief 2a. The centrifuge chuck 1 is rotated to cause the PPC to form a thin, uniform layer 3a through centrifugal force. Through varying speed, rotation time, viscosity and PPC wettability, conditions are selected for fabricating a thin, uniform PPC layer 3a between the solid base 2 and flexible material 4.

Figure 4:
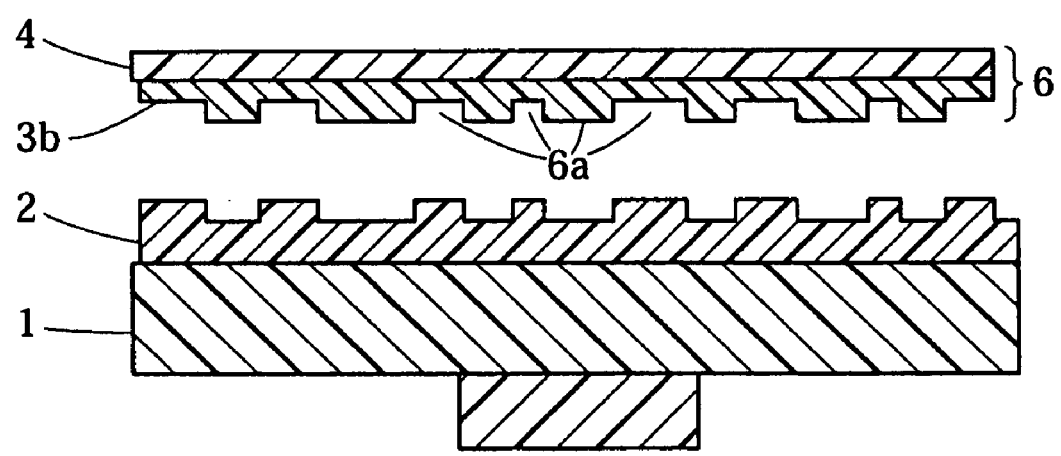
FIG. 4 shows the removal of the resulting replica.

After the layer 3a with specified thickness has been formed, it is irradiated by light 5 with a spectral range appropriate for photopolymerization, thereby photopolymerizing the layer 3a to form a photopolymerized layer 3b. Then, as shown in FIG. 4, the solid base 2 and the photopolymerized layer 3b are separated, thereby forming a replica 6 having an information relief 6a.

Figure 5:
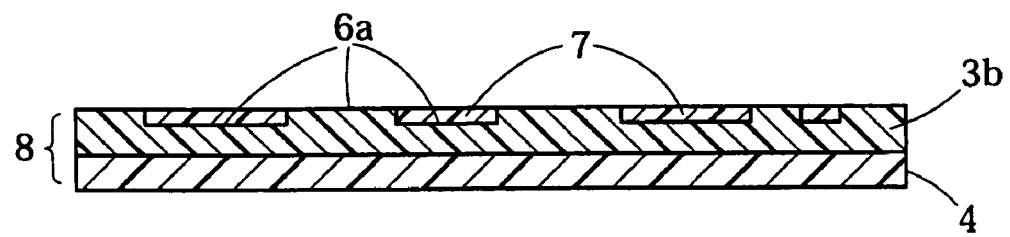
FIG. 5 shows formation of an information layer from the replica.
Figure 6:
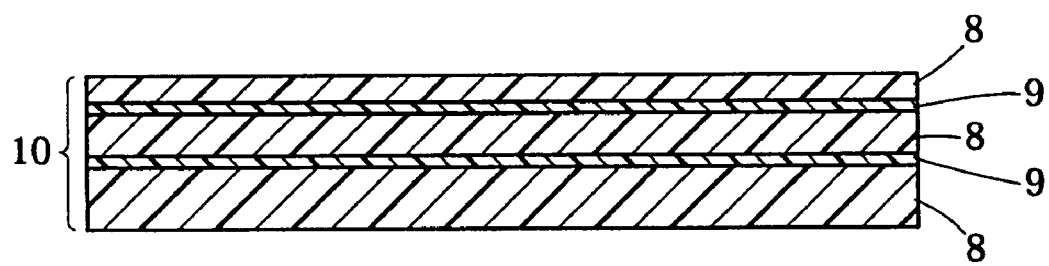
FIG. 6 shows formation of a multilayer medium from multiple information layers.

As shown in FIG. 5, the information relief 6a is filled with a photopolymeric composition 7 with a dye (dye-in-polymer), similar to the procedure described in the above-cited U.S. Pat. No. 6,039,898, to which reference can be made for the details of that procedure. Thus, using for instance a metal matrix and a flexible transparent film, one can obtain a film carrier of a fluorescent IL, for example a film disc 8. As shown in FIG. 6, multiple film discs 8 are further arranged by means of adhesive layers 9 into a multilayer block 10, for instance, an FMD (fluorescent multilayer disc). The adhesive layer thickness is determined by external pressure and can be preset by the magnitude of that pressure. The adhesion can be achieved for instance by piling and pressing a few film discs 8 followed by photo-or thermosolidification. In the case when a flexible transparent matrix and a substrate with pre-arranged layers are used, the FMD is formed by consecutive building-up of layers similarly to the procedure proposed in the above-cited WO 99/47327 A1, to which reference can be made for the details of that procedure.

Alternatively, a relief-carrying layer can be built up by its consecutive moulding from intermediate layers of one or different PPC's on a solid base fixed on the centrifuge chuck. To this end, one of the layer-forming substrates, for example a flexible polymer film, should easily separate from it after the solidification of the layer without affecting the surface in contact. On the surface made free from the film, again a dosed amount of PPC is applied, then covered by a flexible polymer film, centrifuged and photo solidified. Varying the PPC composition for different layers allows a wide-range change of the physical and mechanical properties of layers.

Further, the present invention provides the possibility of combining single and/or multilayer film carriers of fluorescent IL's via adhesive photosolidified layers using a centrifuge. To this end, onto the surface of one layer a dosed amount of adhesive composition is applied and covered by another layer of IL film carrier followed by leveling off in compliance with the procedure described above to obtain a replica under the action of centrifugal force. Then the adhesive layer is photosolidified. The procedure is repeated the requisite number of times to obtain a fluorescent multilayer carrier with a required number of layers.

In addition to the above-mentioned technique for filling the replica's information relief by a dye-containing polymer composition, a further duplication technique is proposed, as will be explained with reference to FIG. 7. The information relief 11a of a replica 11 formed as described above, for example, is filled by means of, for instance, spin-coating with a polymer 12, for instance photosolidified composition containing no dye. In so doing, the material for the replica and photopolymer composition is chosen such that diffusion, for instance thermodiffusion, into the material of the replica 11 is significantly slower than diffusion into the material of the polymer composition 12 filling in the information relief 11a. Thereafter, there occurs diffusion of the fluorescent dye into the polymer composition, for instance in the following way: on top of the polymer composition 12 filling the information relief 11a, a layer 13 of a fluorescent dye with or without a polymer is applied, for instance by spin-coating. Then conditions are prescribed, for instance heating, for which the dye diffuses in the bottom polymer layer. As a result, a replica with an IL filled with a dye-in-polymer is generated. Subsequent procedures of assembling a multilayer disc are done as described above.

Figure 7:
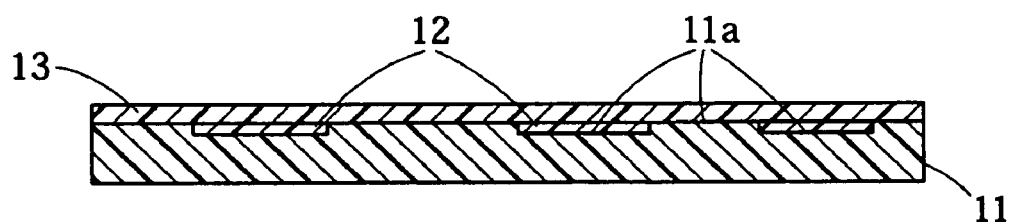
FIG. 7 shows an alternative technique for formation of an information layer from the replica.

Two examples of the technique of FIG. 7 will be disclosed.

EXAMPLE 1

The layer designated to be diffused with a fluorescent dye is formed on the surface of the replica information relief from a 3 wt. % polyacrylic acid solution in a mixture of 80% ethyl glycol and 20% isopropanol by spin-coating. On top, of the ethanol solutions a layer of fluorescent dye is applied, for instance Oxazine 1, with concentration $0.03 \times 10^{-3}$ mol/l. Thereafter the replica with the applied layers is placed into a heating cabinet to be heated for 10 minutes at 70° C.

EXAMPLE 2

Example 2 is similar to Example 1, except that the dye-free PPC from Example 8 is used as a polymer composition.

Thin-layer fluorescent polymer coats with distributed fixed luminescence centers can be prepared by using photosolidified liquid polymer compositions containing luminophores. A composition is spin coated to form a thin liquid film distributed across the replica surface in conformity with the shape of its relief and consisting predominantly of photosolidified, monomers and oligomers and dopants, which determine spectral and luminescent, physical and mathematical, adhesive and other characteristics of the polymer coat following its solidification by UV light. The film is formed on a centrifuge, and photosolidification is generally by cation and/or radical mechanisms. The liquid composition applied should possess a good spreadability on the replica surface, high adhesion, and ease of forming a liquid and solidified film uniformly spread on the surface and differentially in terms of the replica relief. The film can be attained through using a specific composition as well as coating and solidification conditions. Photosolidification of the composition results in a bilayer structure with a polymer replica and a thin-film fluorescent polymer coat. The bilayer structure represents a unit of a single-layer fluorescent information carrier. From similarly generated single-layer carriers, there can be fabricated multilayer fluorescent information carriers of various types by cementing them together.

A liquid composition for a thin-film polymer fluorescent information layer (IL) comprises A polymerizable substance (PS) consisting of one or more substances, A polymerization photoinitiator consisting of one or more substances, A fluorescent dye (FD) consisting of one or more substances, including dyes with functional groups reactive with respect to PS, and An organic solvent consisting of one or more substances, including ones with functional groups reactive with respect to PS.

In addition, ILs can comprise a sensitizer of the polymerization photoinitiator consisting of one or more substances, modifiers improving film-forming and adhesive properties of the polymer layer formed, including ones containing functional groups reactive with respect to PS, components improving the adhesion between the surfaces of the formed IL and the adhesive or buffer layers, at the expense of a chemical reaction between them.

A PS includes photopolymerizable (predominantly by cation and/or radical mechanisms), low- and/or high-molecular components, which are preferably liquid. Photopolymerizable composition components can comprise functional groups photopolymeriazable by both cation and radical mechanisms, with groups of different chemical nature being incorporated in both different substances and the same one simultaneously and accordingly polymerized by a hybrid mechanism. For cation-mechanism-polymerizable components there can be used cyclic esters, formals, acetals, lactones, mono-and polyfunctional epoxides, epoxyoligomers, thiiranes, vinyl monomers including fluorinated and organosilicon compounds, with epoxy compounds being most preferable. For radical-mechanism-polymerizable components there can be used substances containing unsaturated double bonds, predominantly of (metha)acrylic type including fluorinated ones. For components polymerizable by a hybrid mechanism, it is preferable to use glycidyl ethers with unsaturated double bonds. PS may comprise mono- or polyfunctional comonomers that improve the PS sensitivity to the action of actinic radiation and/or physical and mechanical and/or optical and/or spectral and luminescent properties and/or adhesive characteristics of the photosolidified information layer.

For polymerization photo initiators, there can be used heteroorganic or metalloorganic compounds or mixtures thereof. These compounds form homogeneous solutions with the other IL components and generate acids, predominantly Bronsted acids and/or free radicals under the action of actinic radiation in the range of 300–650 nm.

For fluorescent dyes, there can be used photostable dyes having a high luminescence quantum yield, to form homogeneous solutions with the other IL components, and maintain their spectral and luminescent characteristics under IL photosolidification conditions. Dyes should be preferably chosen from the series of laser dyes.

For photopolymerization sensitizers, depending on the chemical structure of the photoinitiator applied, there can be used individually or in mixture aromatic and heteroaromatic compounds, arylated amines, aromatic and heteroaromatic ketones and dyes with their spectra having no overlap with the absorption spectra of the fluorescent dye incorporated in the IL structure.

The fluorescent polymer layer is generated on the replica surface by spin coating of the liquid IL composition with the components as given above, and is photosolidified by UV radiation of specific spectral range until a solid polymer film is formed. The resulting solid polymer film is highly-adhesive to the replica, optically transparent, homogeneous and differentiated with respect to the volume fluorescence layer. The topology and spatial distribution of the excited luminescence intensity are prescribed by the replica surface shape and conditions of applying the liquid composition.

EXAMPLE 3

The polymerizable substance (PS) composition is prepared by mixing components as follows: Bis(4-glycidyloxyphenyl) methane (80 wt %), 1,2,7,8-Diepoxyoctane (10 wt %) and Neopentylglycol (10 wt %). To the PS, fluorescent dye (FD) Rhodamine 6G is added proceeding from $0.01 \times 10^{-3}$ M/l PS. Then, a solvent is prepared consisting of 2-Ethoxyethanol, 2-Propanol and Ethanol in a proportion of 2:2:1 (by volume). The solvent is added to the PS-FD composition to yield a 6 wt % solution. The solution is stirred for 2 hours at 40° C. until complete dissolution of all components in the composition mixture. Upon cooling the solution down to 20° C., Diphenyliodonium hexafluoroarsenate (4 wt %) is added. The resulting solution is stirred for 1 hour, filtered and used for coating the PPC replica.

EXAMPLE 4

By mixing components a PS is prepared consisting of Bisphenol A diglycidyl ether (70 wt %), 1,4-cyclohexanedimethanol diglycidyl ether (15 wt %), and 1,2,7,8-Diepoxyoctane (20 wt %). To the PS, FD Coumarin 314 is added starting from $0.05 \times 10^{-1}$ M/l PS. Then, a solvent is prepared consisting of 2-Ethoxyethanol, 4-Hydroxy-4-methyl-2-pentanone, 2-Propanol and Ethanol in a proportion of 1:1:2:1 (by volume). The PS-FD composition is dissolved in the solvent 35° C. for 4 hours to yield a 4 wt % homogeneous solution. To this solution Diphenyliodonium hexafluoroarsenate (5 wt %) is added. The resulting solution is stirred, filtered and used for coating the PPC replica.

EXAMPLE 5

By mixing components a PS is prepared consisting of Bisphenol A diglycidyl ether (70 wt %), 1,4-Butanediol diglycidyl ether (15 wt %), Bis(3,4-epoxycyclohexylmethyl) adipate (5 wt %) and neopentyl glycol ethohylate (10 wt %). To the PS, FD Coumarin 153 is added starting from $0.05 \times 10^{-3}$ M/l PS. Then, a solvent is prepared consisting of 4-Hydroxy-4-methyl-2-1-Butanol, 2-Propanol, Ethyleneglycol and 2,2,3,3-Tetrafluoro-1-propanol in proportion 1:1:2:1:0.5 (by volume). The PS-FD composition is dissolved in the solvent 40° C. for 3 hours to yield a 5 wt % homogeneous solution. To this solution Diphenyliodonium hexafluoroantimonate (3 wt %) is added. The resulting solution is stirred, filtered and used for coating the PPC replica.

EXAMPLE 6

By mixing components a PS composition is prepared consisting of Diglycidyl-1,2-cyclohexanedicarboxylate (45 wt %), 3-[Bis(glycidyloxymethyl)methoxy]-1,2-propanediol (45 wt %), Poly(Bisphenol A-co-epichlorohydrin), glycidyl end-capped ($M_n$=480) (2 wt %) and Dipentaerythritol (8 wt %). To the PS, FD Rhodamine 6G is added starting from $0.05 \times 10^{-3}$ M/l PS. Then, a solvent is prepared consisting of 4-Hydroxy-4-methyl-2-pentanone, 1-Butanol, methylethyl ketone and Ethanol in a proportion of 2:2:1:1 (by volume). The PS-FD composition is dissolved in the solvent at 40° C. for 4 hours to yield a 5wt % homogeneous solution. To this solution then Diphenyliodonium hexafluoroarsenate and Triphenylsulfonium hexafluoroantimonate are added in a proportion of 1:1 to make the total catalyst concentration 3 wt % with respect to PS. Thereafter the sensitizer thioxanthone is added starting from 10 wt % with respect to the catalyst. The solution is then stirred until complete dissolution of all components, filtered and used for coating the PPC replica.

EXAMPLE 7

By mixing components a PS composition is prepared consisting of 3,4-epoxycyclohexylmethyl-3,4-epoxycyclohexane-carboxylate (80 wt %), 3-diglycidyl-1,2-cyclohexanedicarboxylate (8 wt %), Poly[(o-cresyl glycidyl ether)-co-formaldehyde] ($M_n$=870) (2 wt %) and Poly (caprolactone) triol ($M_n$=300) (10 wt %). To the PS, FD Oxazine 1 is added starting from $0.04 \times 10^{-3}$ M/l PS. Then, a solvent is prepared consisting of 4-Hydroxy-4-methyl-2-2-Methyl-3-heptanone, 3-Methyl-2-butanone and Cyclohexanone in a proportion 1:1:2:2 (by volume). The PS-FD composition is then dissolved in the solvent to yield a 6 wt % homogeneous solution. Thereafter a solution of Triphenylsulfonium hexafluoroantimonate (20 wt %) in Propylene carbonate is prepared and added to the PS-FD solution to make the total catalyst concentration 1.5 wt % with respect to the PS. The resulting solution is then stirred, filtered and used for coating the PPC replica.

EXAMPLE 8

By mixing components a PS composition is prepared consisting of 3,4-epoxycyclohexylmethyl-3,4-epoxycyclohexane-carboxylate (80 wt %), Glycerol proxylate triglycidyl ether (0.1 wt %) and Poly(vinylbutyral-co-vinylalcohol-co-vinyl acetate) (9.9%). To the PS then FD Oxazine 1 is added starting from $0.1 \times 10^{-3}$ M/l PS. Thereupon, a solvent is prepared consisting of 2-Ethoxyethanol, 1-Butanol, 2-Propanol and 3-Methyl-2-butanone in a proportion 4:4:2:1 (by volume). The PS-FD composition is then dissolved in the solvent to yield a 10 wt % homogeneous solution. Thereafter Diphenyliodonium hexafluoroarsenate and Triphenylsulfonium hexafluoroantimonate are added to the solution in a proportion 1:1 to make the total catalyst concentration 3 wt % with respect to the PS and benzophenone as 5 wt % from the catalyst. The resulting solution is then stirred, filtered and used for coating the PPC replica.

EXAMPLE 9

By mixing components a PS composition is prepared consisting of 3,4-epoxycyclohexylmethyl-3,4-epoxycyclohexane-carboxylate (90 wt %), Poly(caprolactone) triol ($M_n$=300) (2 wt %) and Poly(vinylbutyral-co-vinylalcohol-co-vinyl acetate) (8%). To the PS then FD Oxazine 1 is added starting from $0.06 \times 10^{-3}$ M/l PS. Thereupon, a solvent is prepared consisting of 2-Ethoxyethanol, 1-Butanol, 2-Propanol and 2,2,3,3,4,4,5,5-Octafluoro-1-pentanol in a proportion 1:1:1:4 (by volume). The PS-FD composition is then dissolved in the solvent to yield a 4% homogeneous solution. Thereafter a mixture of Triphenylsulfonium hexafluoroarsenate and Triphenylsulfonium hexafluoroantimonate is added to the solution in proportion 2:1 to make the total catalyst concentration 2 wt % with respect to the PS weight. The resulting solution is then stirred until complete dissolution of all components, filtered and used for coating the PPC replica.

EXAMPLE 10

By mixing components a PS composition is prepared consisting of 3,4-epoxycyclohexylnethyl-3,4-epoxycyclohexane-carboxylate (90 wt %), Glycidyl methacrylate (2 wt %) and Poly(vinylbutyral-co-vinylalcohol-co-vinyl acetate) (8%). To the PS then an FD is added consisting of a mixture of Oxazine 170 and Oxazine 1 in a proportion 1:10 (by weight) starting from $0.1 \times 10^{-3}$ M/l PS. Thereupon, a solvent is prepared consisting of 2-Ethoxyethanol, 1-Butanol, 2-Propanol and 1,1,1,3,3,4,4,4-Octafluoro-2-butanol in proportion of 1:1:1:2 (by volume). The PS-FD composition is then dissolved in the solvent to yield a 3 wt % homogeneous solution. Thereafter Triphenylsulfonium hexafluoroantimonate is added to the solution on the basis of 1.5 wt % of the catalyst with respect to the PS weight. The resulting solution is then stirred until complete dissolution of all components, filtered and used for coating the PPC replica.

EXAMPLE 11

By mixing components a PS composition is prepared consisting of 3,4-epoxycyclohexylmethyl-3,4-epoxycyclohexane-carboxylate (10 wt %), 4-Vinyl-1-cyclohexane diepoxide (70 wt %), Poly(propylene glycol) diglycidyl ether ($M_n$=640) (10 wt %), and Glycidyl methacrylate (10 wt %). To the PS then FD Rhodamine 6G is added starting from $0.03 \times 10^{-3}$ M/l PS. Thereupon, a solvent is prepared consisting of 4-Hydroxy-4-methyl-2-pentanone, 1-Butanol, 1,1,1,5,5,6,6,6-Octafluoro-2,4-hexanedione, and Methylethyl ketone in a proportion 2:2:1:1 (by volume). The PS-PD composition is then dissolved in the solvent at 40° C. for 2 hours to yield a 3 wt % homogeneous solution. Thereafter a mixture of Triphenylsulfonium hexafluoroarsenate and Triphenylsulfonium hexafluoroantimonate is added to the solution in a proportion of 2:1 to make the total catalyst concentration 2.5 wt % with respect to the PS weight. The resulting solution is then stirred until complete dissolution of all components, filtered and used for coating the PPC replica.

EXAMPLE 12

By mixing components a PS composition is prepared consisting of Ethylene glycol divinyl ether (85 wt %), Di(ethylene glycol)divinyl ether (10 wt %) and Trimethylolpropane trivinyl ether (5%). To the PS then an FD is added consisting of a mixture of Coumarin 334 and Pyrromethene 567 in proportion of 1:1 (by weight) starting from $0.04 \times 10^{-3}$ M/l PS. Thereupon, a solvent is prepared consisting of 2-Ethoxyethanol, 2-Butanol, 2-Propanol, 1,1,1,3,3,4,4,4-Octafluoro-2-butanol, 2,2,3,3-Tetrafluoro-1-propanol in equal proportions (by volume). The PS-FD composition is then dissolved in the solvent to yield a 10 wt % homogeneous solution. Thereafter, Triphenylsulfonium hexafluoroantimonate is added to the solution on the basis of 3.5 wt % of the catalyst with respect to the PS weight. The resulting solution is then stirred until complete dissolution of all components, filtered and used for coating the PPC replica.

EXAMPLE 13

The composition as per Example 3 is spin-coated onto a PPC replica as per Example 17 at 5000 rpm. The resulting coat is then irradiated by UV light from a 500-W high-pressure mercury lamp for 8 seconds at a distance of 30 cm. Solidification of the liquid IL yields a fluorescent information carrier.

Materials for Replica

For replica materials, PPC's are used which under the action of light transform from the liquid state to the solid state and replicate the relief of the matrix material. Depending on the fabrication technique, the thickness of the generated matrix material varies in the range from 1 to 50_m.

For fabricating a film carrier for an IL, as a substrate for the replica, there can be used optically uniform, transparent birefringent films of at least 40 nm/mm, as well as photosolidified films of PPC prepared as described above.

The photosolidified replica material must be resistant to solvents used for IL fabrication, and be optically uniform and transparent.

For PPC materials there can be used monomers and oligomers polymerizable by radical and hybrid (radical and cation) mechanisms.

A PPC polymerizable by a radical mechanism can be composed of mono-and polyfunctional monomers and oligomers with unsaturated bonds, preferably from the (meth) acrylic series, such as:

vinyl monomers and polyfunctional vinyl oligomers;
unsaturated polyesters;
diene oligomers.

The number of monomers and oligomers in the PPC can vary from 0 to 100 wt %.

For photoinitiators of radical polymerization there can be used photoinitiators generating radicals when illuminated in the spectral range from 300 to 600 nm.

For PPC polymerizable by hybrid mechanism there can be used all the above-listed monomers and oligomers as well as mono-and polyfunctional alicyclic epoxides, epoxy-diane resins, aliphatic epoxy resins, epoxy novolacs and laproxides. To obtain requisite properties of the replica, hybrid PPCs can be doped with copolymerizable modifiers, such as simple and complex copolymerizable modifiers: simple and complex aromatic and aliphatic oligoester mono-and polyoles, di-and polyfunctional alcohols, phenolformaldehyde novolacs and polyalkyleneoxides (0–50%).

For photoinitiators (0–10%) there can be used a mixture of photoinitiators generating radicals and protons (Bronsted acids) in the spectral range 300–600 nm.

For modifiers, the PPC polymerizable by both radical and cation mechanisms can be doped with polymer materials (0–80%) compatible with PPC components both prior to and following the solidification.

For sensitizers, the PPC polymerizable by both radical and cation mechanisms can also be doped with compounds that do not overlap the spectral range of the fluorescent information carrier, i.e. 300–600 nm.

PPCs used for fabricating replicas can also contain light absorbers (0–5%) in the UV visible spectral range that do not overlap the spectral range of the fluorescent information carrier operation.

EXAMPLE 14

To make a PPC for a replica, 20 wt % of 1,6-hexanediol diacrylate (HDDA) (SR-238, Cray Valley), 35 wt % of ethoxylated bisphenol A diacrylate (SR-602, Cray Valley), 20 wt % of epoxy novolac acrylate oligomer in HDDA (CN 112B70, Cray Valley), and 2 wt % of the photoinitiator DAROCURE 1173 (Ciba-Geigy) are mixed at room temperature and filtered. The dosed amount of PPC is applied onto a nickel matrix and covered by a transparent polycarbonate substrate. The resulting "sandwich" is irradiated by a 500-W UV-light lamp in the range of 300–400 nm for 20 seconds. The solidified replica with the substrate is separated from the nickel matrix and used for IL coating.

EXAMPLE 15

Example 15 is similar to Example 14 except that as a PPC for the replica, the following composition is used: 63 wt % of polyester acrylate (Synocure AC-1309, Cray Valley), 37 wt % of Styrene and 2 wt % of benzoin isobutyl ether.

EXAMPLE 16

Example 16 is similar to Example 14 except that as a PPC for the replica, the following composition is used: 23 wt % of modified urethane triacrylate (CN 922, Cray Valley), 5 wt % of 2-(2-ethoxyethoxy)ethylacrylate (SR 256, Cray Valley), 15 wt % of monopropyleneglycol acrylate, 57 wt % of propoxylated trimethylopropane triacrylate (SR 352, Cray Valley), and 2 wt % of the photoinitiator IRGACURE 784 (Ciba-Geigy).

EXAMPLE 17

Example 17 is similar to Example 14 except that as a PPC for the replica, the following composition is used: 20% of oligocarbonate methacrylate (OCM-2), 80 wt % of aliphatic urethane triacrylate with $M_n$=5000, and 2 wt % of the photoinitiator IRGACURE 651 (Ciba-Geigy).

EXAMPLE 18

Example 18 is similar to Example 14 except that as PPC for the replica, the following composition is used: 50 wt % ethoxylated bisphenol A diacrylate (SR 349, Cray Valley), 10 wt % pentaerythritol triacrylate (SR 415, Cray Valley), 40 wt % of tripropylene glycol triacrylate (SR 306, Cray Valley) and 1wt % of the photoinitiator IRGACURE 1700 (Ciba-Geigy).

EXAMPLE 19

Example 19 is similar to Example 14 except that as a PPC for the replica, the following composition is used: oligocarbonate methacrylate (OCM-2, Alvar-M, Ltd.), 1 wt % of the photoinitiator IRGACURE 651 (Ciba-Geigy) and 1 wt % of the photoinitiator IRGACURE 1173 (Ciba-Geigy).

EXAMPLE 20

Example 20 is similar to Example 14 except that as a PPC for the replica, the following composition polymerizable by hybrid mechanism is used: 10 wt % of 3,4-epoxycyclohexylmethyl-3,4-epoxycyclohexane carboxylate, 2 wt % of polypropylenglycol M.W. 400, 15 wt % of tripropyleneglycol divinyl ester, 15 wt % of trimethylolpropane triacrylate (SR 351, Cray Valley), and 58 wt % of olygocarbonate methacrylate (OCM-2, Alvar-M, Ltd.); as photoinitiators, 2 wt % IRGACURE 500 (Ciba-Geigy) and 2 wt % triarylsulfonium hexafluorophosphate are used.

EXAMPLE 21

Example 21 is similar to Example 19 except that as a PPC for the replica, the following composition is used: 20 wt % of diepoxide propyleneglycol M.W. 600 (Laproxyd 603; Macromer, Ltd.), 30 wt % of bisphenol A epoxy acrylate (CN 104, Cray Valley), 50 wt % of propoxylated neopentyl glycol diacrylate (SR 9003, Cray Valley), 1 wt % of the photoinitiator IRGACURE 149 (Ciba-Geigy) and 1 wt % of the photoinitiator IRGACURE 261 (Ciba-Geigy).

EXAMPLE 22

Example 22 is similar to Example 17 except that for a photoinitiator 2 wt % of phenanthrenequinone (Aldrich) and 1 wt % of triethanolamine are used.

EXAMPLE 23

Example 23 is similar to Example 17 except that for a photoinitiator 2 wt % of camphorquinone (Aldrich) and 1 wt % of triethanolamine are used.

EXAMPLE 24

Example 24 is similar to Example 17 except that for a photoinitiator 1 wt % of Eosin B (Aldrich), 1 wt % of Dibutylaniline and 2 wt % of the photoinitiator IRGACURE 651 (Ciba-Geigy) are used.

EXAMPLE 25

Example 25 is similar to Example 19 except that as a PPC for the replica, the following composition is used: 20 wt % of poly(vinyl butyral-co-vinyl alcohol-co-vinyl acetate) M.W. 70000 (Aldrich), 50 wt % of 1,6-hexanediol diacrylate, 30 wt % of 4-vinyl-1-cyclohexane 1,2-epoxide, 1 wt % of the photoinitiator IRGACURE 500 (Ciba-Geigy), 2 wt % of UVI 6974 (Union Carbide) and 2 wt % of Triarylsulfonium hexafluoroantimonate.

EXAMPLE 26

Example 26 is similar to Example 13 except that 0.1 wt % of UV absorber 2,4,2',4'-Tetraoxybenzophenone is doped in the composition.

For sticking individual IL film carriers together in the multilayer fluorescent carrier via adhesive layers there can be used photo-and/or thermosolidified polymer compositions. The adhesive material must meet the following requirements:

- it must have a good adhesion with respect to the information layer PS and the film substrate material for the replica;
- it must not destroy and/or distort the fluorescent information field disposed on the relief-carrying surface of the replica;
- it must enhance the IL contrast as compared to the contrast on the single film IL carrier.

The above requirements of the adhesive material can be satisfied through using a monomeric-oligomeric composition in combination with special dopants. Such dopants bleach the fluorescent dye disposed on the surface of the replica without contacting the dye disposed in the information pit.

For PPC components for the adhesive layer there can be used the whole list of monomers and oligomers as given above with the preparation procedures described in the above-mentioned examples.

For thermosolidified components there can be used monomer and polymer resins of different functionality, laprolates, and urethane-containing monomers and oligomers.

For bleaching dopants there can be used compounds that are oxidizers with respect to the fluorescent dye, for example free radicals resulting from the initiator decomposition under the action of heat and light, as well as catalysts: aliphatic and aromatic amines.

EXAMPLE 27

Example 28 is similar to Example 17 except that for an adhesive layer, the PPC is also doped with 3 wt % photoinitiator IRGACURE 1700 (Ciba-Geigy).

EXAMPLE 28

Example 28 is similar to Example 17 except that the PPC is additionally doped with 4 wt % benzoyl peroxide and 0.1 wt % dibutylaniline.

While various preferred embodiments have been set forth above, it will be readily apparent that other embodiments can be realized within the scope of the invention. For example, while specific examples of compositions have been given, any other compositions having the desired qualities can be used. Also, the present invention can be adapted to the manufacture of any optical information storage medium (disc, card, etc.). Therefore, the present invention should be construed as limited only by the appended claims.

We claim:

1. A method of making an optical information storage medium, the method comprising:
   (a) providing a base and a covering layer, with at least one of the base and the covering layer having a first relief pattern on a side;
   (b) disposing a polymerizable composition in contact with the side(s) having the relief pattern and between the base and covering layer while spinning the base, the polymerizable composition and the covering layer to distribute the polymerizable composition;
   (c) polymerizing the polymerizable composition while the polymerizable composition is distributed between the base and the covering layer to form a polymerized layer having at least one second relief pattern corresponding to the first relief pattern(s);
   (d) separating the polymerized layer from the first relief pattern(s) to provide a layer having a specific arrangement of a plurality of recesses;
   (e) preparing a filling composition comprising a fluorescent dye, a polymerizable substance and a solvent wherein the polymerizable substance comprises a first compound having at least one glycidyl ether functionality that is polymerizable by hybrid mechanism in an amount of 0.1–85 wt % of the substance, a second compound having an epoxy group that is polymerizable by cation mechanism in an amount of 5–90 wt % of the substance, and a first alcohol in an amount of 0–10 wt % of the substance, and wherein the solvent comprises a second alcohol that is different from the first alcohol; and
   (f) filling the plurality of recesses of the second relief pattern(s) with the filling composition to provide a fluorescent information storage medium that encodes information.

2. The method of claim 1, wherein the polymerizable composition is photopolymerizable in light having a photopolymerizing wavelength; the covering layer is transparent to the photopolymerizing wavelength; and step (c) comprises applying the light having the photopolymerizing wavelength to the polymerizable composition through the covering layer.

3. The method of claim 1, wherein the polymerizable substance comprises bis(4-glycidyloxyphenyl) methane in an amount of 80 wt % of the substance, 1,2,7,8-diepoxyoctane in an amount of 10 wt % of the substance and neopentylglycol in an amount of 10 wt % of the substance; the fluorescent dye comprises rhodamine 6G; and the solvent comprises 2-ethoxyethanol, 2-propanol and ethanol in a proportion of 2:2:1 by volume.

4. The method of claim 1, wherein the polymerizable substance comprises bisphenol A diglycidyl ether in an amount of 75 wt % of the substance, 1,4-cyclohexanedimethanol diglycidyl ether in an amount of 5 wt % of the substance, and 1,2,7,8-diepoxyoctane in an amount of 20 wt % of the substance; the fluorescent dye comprises coumarin 314; and the solvent comprises 2-ethoxyethanol, 4-hydroxy-4-methyl-2-pentanone, 2-propanol and ethanol in a proportion of 1:1:2:1 by volume.

5. The method of claim 1, wherein the polymerizable substance comprises bisphenol A diglycidyl ether in an amount of 70 wt % of the substance, 1,4-butanediol diglycidyl ether in an amount of 15 wt % of the substance, bis(3,4-epoxycyclohexylmethyl) adipate in an amount of 5 wt % of the substance and neopentyl glycol ethoxylate in an amount of 10 wt % of the substance; the fluorescent dye comprises coumarin 153; and the solvent comprises 4-hydroxy-4-methyl-2-pentanone, 1-butanol, 2-propanol, ethyleneglycol and 2,2,3,3-tetrafluoro-1-propanol in a proportion of 1:1:2:1:0.5 by volume.

6. The method of claim 1, wherein the polymerizable substance comprises 3,4-epoxycyclohexylmethyl-3,4-epoxycyclohexane-carboxylate in an amount of 80 wt % of the substance, 3-diglycidyl-1,2-cyclohexanedicarboxylate in an amount of 8 wt % of the substance, poly[(o-cresyl glycidyl ether)-co-formaldehyde] in an amount of 2 wt % of the substance and poly(caprolactone) triol in an amount of 10 wt % of the substance; the fluorescent dye comprises oxazine 1; and the solvent comprises 4-hydroxy-4-methyl-2-pentanone, 2-methyl-3-heptanone, 3-methyl-2-butanone and cyclohexanone in a proportion of 1:1:2:2 by volume.

7. The method of claim 1, wherein the polymerizable substance comprises 3,4-epoxycyclohexylmethyl-3,4-epoxycyclohexane-carboxylate in an amount of 80 wt % of the substance, glycerol proxylate triglycidyl ether in an amount of 0.1 wt % of the substance, and poly(vinylbutyral-co-vinylalcohol-co-vinyl acetate in an amount of 9.9 wt % of the substance; the fluorescent dye comprises oxazine 1; and the solvent comprises 2-ethoxyethanol, 1-butanol, 2-propanol and 3methyl-2-butanone in a proportion of 4:4:2:1 by volume.

8. The method of claim 1, wherein the polymerizable substance comprises 3,4-epoxycyclohexylmethyl-3,4-epoxycyclohexane-carboxylate in an amount of 10 wt % of the substance, 4-vinyl-1-cyclohexane diepoxide in an amount of 70 wt % of the substance, poly(propylene glycol) diglycidyl ether in an amount of 10 wt % of the substance, and glycidyl methacrylate in an amount of 10 wt % of the substance; the fluorescent dye comprises rhodamine 6 G; and the solvent comprises 4-hydroxy-4-methyl-2-pentanone, 1-butanol, 1,1,1,5,5,6,6,6-octafluoro-2,4-hexanedione, and methylethyl ketone in a proportion 2:2:1:1 by volume.

9. The method of claim 1, wherein the polymerizable substance comprises 3,4-epoxycyclohexylmethyl-3,4-epoxycyclohexane-carboxylate in an amount of 80 wt % of the substance, glycerol proxylate triglycidyl ether in an amount of 0.1 wt % of the substance and poly(vinylbutyral-co-vinylalcohol-co-vinyl acetate in an amount of 9.9 wt % of the substance.

10. The method of claim 1, further comprising (f) repeating steps (a)–(e) a plurality of times to form a plurality of information layers; and (g) adhering the plurality of information layers together to form the optical information storage medium as a multilayer medium.

11. The method of claim 10, wherein the polymerizable composition is doped with a mixture that is 25% by weight bis(2,6-dimethoxybenzoyl)-2,4,4-trimethylpentylphosphine oxide and 75% by weight of 2-hydroxy-2-methyl-1-phenyl-propan-1-one in an amount of 3 wt % of the polymerizable composition.

12. The method of claim 10, wherein the polymerizable composition is doped with benzoyl peroxide in an amount of 4 wt % of the polymerizable composition and dibutylaniline in an amount of 0.1 wt % of the polymerizable composition.

13. A method of making an optical information storage medium according to claim 1, wherein the polymerizable composition comprises alkylacrylate and triacrylate in a ratio of about 1:0.25 to 1:16, and a photoinitiator.

14. The method of claim 13, wherein the photoinitiator is present in an amount of 2–wt % of the polymerizable composition.

15. The method of claim 13, wherein the polymerizable composition comprises oligocarbonate methacrylate in an amount of about 20 wt % of the polymerizable composition, aliphatic urethane triacrylate in an amount of about 80 wt % of the polymerizable composition, and 2,2,-dimethoxy-1,2-diphenylethan-1-one in an amount of about 2 wt % of the polymerizable composition.

16. The method of claim 13, wherein the polymerizable composition comprises 3,4-epoxycyclohexylmethyl-3,4-epoxycyclohexane carboxylate in an amount of about 10 wt % of the polymerizable composition, polypropylenglycol in an amount of about 2 wt % of the polymerizable composition, tripropyleneglycol divinyl ester in an amount of about 15 wt % of the polymerizable composition, trimethylolpropane triacrylate in an amount of about 15 wt % of the polymerizable composition, and oligocarbonate methacrylate in an amount of about 58 wt % of the polymerizable composition; and step (c) comprises using a photoinitiator comprising a mixture of 50% by weight 1-hydroxycyclohexyl phenyl ketone and 50% by weight benzophenone in an amount of about 2 wt % of the polymerizable composition, and triarylsulfonium hexafluorophosphate in an amount of 2 wt % of the polymerizable composition.

17. The method of claim 13, wherein the photoinitiator comprises a quinone, an amine, or a mixture of a quinone and amine.

18. The method of claim 17, wherein the photoinitiator comprises a quinone in an amount of 2 wt % of the polymerizable composition and an amine in an amount of 1 wt % of the polymerizable composition.

19. The method of claim 17, wherein the quinone is phenanthrenequinone or camphorquinone and the amine is triethanolamine.

20. The method of claim 13, wherein the polymerizable composition comprises modified urethane triacrylate in an amount of about 23 wt % of the polymerizable composition, 2-(2-ethoxyethoxy)ethyl-acrylate in an amount of about 5 wt % of the polymerizable composition, monopropyleneglycol acrylate in an amount of about 15 wt % of the polymerizable composition, propoxylated trimethylopropane triacrylate in an amount of about 57 wt % of the polymerizable composition, and bis(η5-2,4-cyclopentadien-1-yl)-(bis(2-6-difluoro-3-(1H-pyr-rol-1-yl)-phenyl)titanium in an amount of about 2 wt % of the polymerizable composition.

21. The method of claim 13, wherein the photoinitiator comprises eosin B in an amount of 1 wt % of the polymerizable composition, dibutylaniline in an amount of 1 wt % of the polymerizable composition, and 2,2,-dimethoxy-1,2-diphenylethan-1-one in an amount of 2 wt % of the polymerizable composition.

* * * * *

UNITED STATES PATENT AND TRADEMARK OFFICE
CERTIFICATE OF CORRECTION

PATENT NO. : 7,226,637 B2  
APPLICATION NO. : 09/761647  
DATED : June 5, 2007  
INVENTOR(S) : Dorozhkina et al.

It is certified that error appears in the above-identified patent and that said Letters Patent is hereby corrected as shown below:

Column 4:
Line 7, after "of the ethanol", change "solutions" to -- solution, --.

Column 5:
Line 40, after "radiation of" insert -- a --.
Line 67, change "(70 wt %)" to -- (75 wt %) --.

Column 6:
Line 1, change "(15 wt %)" to -- (5 wt %) --.
Line 3, change "$0.05 \times 10^{-1}$" to -- $0.05 \times 10^{-3}$ --.
Line 7, before "35°C." insert -- at --.
Line 19, change "4-Hydroxy-4-methyl-2-1-Butanol," to
-- 4-Hydroxy-4-methyl-2-pentanone, 1-Butanol, --.
Line 20, before "proportion" insert -- a --; and after "proportion" insert -- of --.
Line 22, before "40°C." insert -- at --.
Line 60, change "4-Hydroxy-4-methyl-2-2-" to -- 4-Hydroxy-4-methyl-2-pentanone, 2- --.
Line 62, before "1:1:2:2" insert -- of --.

Column 7:
Line 13, before "4:4:2:1" insert -- of --.
Line 18, before "1:1" insert -- of --.
Line 33, before "1:1:1:4" insert "of".
Line 34, change "4%" to -- 4 wt % --.
Line 37, before "proportion" insert -- a --; and after "proportion" insert -- of --.
Line 50, before "1:10" insert -- of --.
Line 53, before "proportion" insert -- a --.

Column 8:
Line 6, before "2:2:1:1" insert -- of --.
Line 24, before "proportion" insert -- a --.
Line 66, after "unsaturated polyesters;" insert -- and --.

Column 9:
Line 66, change "20%" to -- 20 wt % --.

Column 10:
Line 6, before "PPC" insert -- a --.

UNITED STATES PATENT AND TRADEMARK OFFICE
CERTIFICATE OF CORRECTION

PATENT NO. : 7,226,637 B2
APPLICATION NO. : 09/761647
DATED : June 5, 2007
INVENTOR(S) : Dorozhkina et al.

It is certified that error appears in the above-identified patent and that said Letters Patent is hereby corrected as shown below:

Column 11:
Line 52, after "Example" change "28" to -- 27 --.
Line 53, after "3 wt %" insert -- of the --.

Column 14:
Line 6 (claim 14, line 2), change "2-wt %" to -- 2-4 wt % --.

Signed and Sealed this

Seventh Day of August, 2007

JON W. DUDAS
*Director of the United States Patent and Trademark Office*